US006972705B1

(12) United States Patent
Fei et al.

(10) Patent No.: US 6,972,705 B1
(45) Date of Patent: Dec. 6, 2005

(54) SIGNAL PROCESSING SYSTEM HAVING AN ADC DELTA-SIGMA MODULATOR WITH SINGLE-ENDED INPUT AND FEEDBACK SIGNAL INPUTS

(75) Inventors: Xiaofan Fei, Austin, TX (US); Johann Gaboriau, Austin, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/011,732

(22) Filed: Dec. 14, 2004

(51) Int. Cl.[7] .............................................. H03M 3/00
(52) U.S. Cl. ........................ 341/143; 341/172; 341/161
(58) Field of Search ............................... 341/143, 172, 341/131, 161, 118, 120

(56) References Cited

U.S. PATENT DOCUMENTS

| 6,111,529 | A * | 8/2000 | Maulik et al. ............... 341/143 |
| 6,147,631 | A * | 11/2000 | Maulik et al. ............... 341/143 |
| 6,172,630 | B1 * | 1/2001 | Nelson ........................ 341/143 |
| 6,369,729 | B1 * | 4/2002 | Srinivasan et al. ......... 341/143 |
| 6,522,278 | B1 * | 2/2003 | Rhode et al. ............... 341/143 |
| 6,556,159 | B1 * | 4/2003 | Fei et al. .................... 341/143 |
| 6,583,662 | B1 * | 6/2003 | Lim .......................... 327/553 |
| 6,653,967 | B2 * | 11/2003 | Hamashita .................. 341/143 |
| 6,724,332 | B1 * | 4/2004 | Melanson ................... 341/143 |
| 6,768,443 | B2 * | 7/2004 | Willis ......................... 341/172 |

OTHER PUBLICATIONS

B.E. Bosser et al., "The Design of Sigma-Delta Modulations Analog-to-Digital Converters", IEEE Journal of Solid-State Circuits, Dec. 1998, pp. 1298-1307.
D. Johns et al., "Analog Integrated Circuit Design", John Wiley & sons Inc., p. 543 "No Month" "No Year".

* cited by examiner

*Primary Examiner*—Lam T. Mai
(74) *Attorney, Agent, or Firm*—Hamilton & Terrile, LLP; Kent B. Chambers

(57) ABSTRACT

Signal processing systems described herein include an analog-to-digital delta sigma modulator to process a single-ended input signal using a single-ended analog feedback reference signal. The delta sigma modulator includes a switched capacitor circuit that integrates a difference between the single-ended input signal and the single-ended analog feedback signal derived from a quantization output of the delta sigma modulator. Embodiments of the switched capacitor circuit allow the delta sigma modulator to be implemented with fewer switches, less complicated reference signal generators, and smaller capacitors relative to conventional counterparts. Thus, embodiments of the delta sigma modulator described herein can cost less to build and use less power. Embodiments of the signal processing systems can be implemented in single and multi-bit delta sigma modulators and various sampling topologies, including single and double sampling topologies.

30 Claims, 9 Drawing Sheets

SIGNAL PROCESSING SYSTEM HAVING AN ADC DELTA-SIGMA MODULATOR WITH SINGLE-ENDED INPUT AND FEEDBACK SIGNAL INPUTS

BACKGROUND OF THE INVENTION

1. Field of the Invention

The present invention relates in general to the field of signal processing, and more specifically to an analog-to-digital system having a switched capacitor delta-sigma modulator for processing a single-ended input signal and a single-ended analog feedback signal.

2. Description of the Related Art

Many signal processing systems implement look-ahead delta-sigma modulators to process analog and digital signals. "Delta-sigma modulators" are also commonly referred to using other interchangeable terms such as "sigma-delta modulators", "delta-sigma converters", "sigma delta converters", and "noise shapers".

FIG. 1 depicts a conventional topology of an analog-to-digital converter ("ADC") delta sigma modulator 100 that converts a single-ended input signal, $V_{in}$, into a binary digital output signal, D. The delta sigma modulator 100 includes an adder 102 that adds the input signal $V_{in}$ to a negative of an analog feedback signal ("$V_{fb}$") from digital-to-analog converter ("DAC") 104 to determine a difference signal, $V_{diff}$, i.e. $V_{diff}=V_{in}-V_{fb}$. Noise shaping filter 106 with a transfer function H(z) filters difference signal, $V_{diff}$, to shift noise signals out of the baseband, e.g. 0 Hz to 20 kHz for audio applications, and integrate $V_{diff}$. The quantizer 108 quantizes the output signal of filter 106. In a one-bit delta sigma modulator, the quantizer 108 quantizes the output signal of filter 106 as either a logical +1 or −1, and multi-bit quantizers use multiple bits to quantize the output signal of filter 106. Signal D represents the output signal of delta sigma modulator 100. Delta sigma modulator 100 includes a feedback loop to feedback signal D to DAC 104. Multi-bit delta sigma modulators include dynamic element matching components 110 in the feedback path between the output of quantizer 108 and the input of DAC 104. The DAC 104 converts the quantizer output signal D into an analog feedback signal Vref. The analog feedback signal Vref=Vref+ when the output D of quantizer 108=+1, and signal Vref=Vref− when the output signal D of quantizer 108=−1. Generally, DAC 104 converts a one-bit delta sigma modulator logical +1 output to a predetermined voltage and converts a logical −1 to a lower voltage.

FIG. 2 depicts delta sigma modulator 100 with a third order, feed forward filter 106. Filter 106 includes three integration stages, $I_1$, $I_2$, and $I_3$, and a local resonator feedback gi. The output signals of each integration stage are scaled by factors $k_1$, $k_2$, and $k_3$. The particular design of filter 106 is a matter of design choice using well-known filter design principles.

FIG. 3A depicts a switched capacitor circuit 300 that implements adder 102, integrator $I_1$, and DAC 104. In general, switched capacitor circuit 300 uses a sampling circuit, sampling capacitors Csp1 and Csp2, reference capacitors Crp and Crs, and positive and negative feedback capacitors Copp and Copn, to sample Vref, determine $V_{in}$+(−Vref), and integrate $V_{in}$+(−Vref). Input signal $V_{in}$ is a single-ended input and is referenced against signal Vcm1 when sampling at time t.

A sampling circuit of switched capacitor circuit 300 includes a set of switches 301–306 that conduct in accordance with switch control signal (P1, switches 307 and 308 conduct in accordance with switch control signal φ1 when D equals logical +1. Switches 309 and 310 conduct in accordance with switch control signal φ2 when $\overline{D}$ equals a logical +1, and switches 312–319 that conduct in accordance with switch control signal φ2. Each bit of output signal D is an element of the set {+1, −1}, and D is the complement of $\overline{D}$ on a bit-by-bit basis.

As depicted in FIG. 3B, switch control signals φ1 and φ2 are non-overlapping. Control signals φ1 and φ2 can be generated using a clock signal generator. φ1+ and φ2+ indicate logical +1 signals, and φ1− and φ2− indicate logical −1 signals. The description assumes that switches under the control of signals φ1 and φ2 conduct for logical +1 and do not conduct for logical −1, and the actual voltage or current values of logical +1 and logical −1 are switch dependent. The frequency and shape of control signals φ1 and φ2 is a matter of design choice. When φ1 is a logical +1, φ2 is a logical −1, and assuming that Vcm1=Vcm2=0, the switched capacitor circuit 300 samples $V_{in}$(k) across capacitor Csp1, Vcm across capacitor Csp2, and Vref across capacitors Crp and Crs. When φ1 is a logical −1, φ2 is a logical +1, and assuming Vcm1=Vcm2=0, switched capacitor circuit 300 differentially applies $V_{in}$(k−1)−Vref(k−1) and Vcm-Vref across the input terminals of a differential output operational-amplifier 320. Charge in proportion to $V_{in}$−Vref and Vcm1−Vref is integrated by switched capacitor circuit 300. Vref=Vref+ if D=+1, and Vref= Vref− if D=−1.

If:

TABLE 1

Csp = Csn = Cs
Crp = Crn = Cr
Copp = Copn = Cop
Vref +=− Vref−
Vcm1 = Vcm2 = 0
D□ {+1, −1}.

Vout=Voutp−Voutn; and $Vout(k)=Voutp(k-1)+Vin(k-1)\cdot Cs/Cop-2\cdot Vref\cdot D(k-1)\cdot Cr/Cop$.

Reference voltage Vcm1 can be any reasonable reference voltage that allows switched capacitor circuit 300 to sample input signal Vin.

FIG. 4 depicts a double sampling switched capacitor circuit 400. Switched capacitor circuit 400 double samples the input signal $V_{in}$, using sampling circuit 402, and differentially double samples reference analog feedback signal Vref using sampling circuit 404. Using the assumptions of Table 1 and since feedback signal Vref is differentially double sampled and single ended input signal $V_{in}$ is double sampled:

$Vout(k)=Vout(k-1)+2\cdot V_{in}(k-1)\cdot Cs/Cop-4\cdot Vref\cdot D(k-1)\cdot Cr/Cop$.

One of the drawbacks of switched capacitor circuits 300 and 301 is that Vcm1 becomes part of the input signal $V_{in}$. Accordingly, buffer 322 is designed to provide a low-noise reference voltage Vcm. For example, buffer 322 can be designed as an operational-amplifier configured as a unity gain voltage follower. Buffer 322 can increase the cost of generating voltage Vcm due to, for example, increased part costs and power consumption.

Another drawback of switched capacitor circuits 300 and 400 is the complexity of the sampling circuits and the number of switches involved. Increasing the number of switches increases costs and potentially increases noise within delta sigma modulator 100. Additionally, the sampling capacitors Csp1 and Csp2 and reference capacitors Crp and Crs are generally large, and, thus, expensive.

SUMMARY OF THE INVENTION

In one embodiment of the present invention, a signal processing system includes a single-ended input analog-to-digital delta sigma modulator. the analog-to-digital delta-sigma modulator further includes a switched capacitor circuit having a differential integrator. The differential integrator includes a first input terminal to receive a first input signal derived from a sampled, single-ended input signal relative to a first reference voltage, a second input terminal to receive a second input signal derived from a sampled, single-ended analog feedback signal relative to a second reference voltage, and integration circuitry to provide a differential output representing an integration of a difference between the first and second input signals.

In another embodiment of the present invention, a method of converting an analog signal into a digital signal using a single-ended delta-sigma modulator having a switched capacitor circuit includes deriving a first input signal from a sampled, single-ended input signal relative to a first reference voltage. The method further includes applying the first input signal to a first terminal of a differential integrator of the switched capacitor circuit, deriving a second input signal from a sampled, single-ended analog feedback signal relative to a second reference voltage, and applying the second input signal to a second terminal of the differential integrator concurrently with the application of the first input signal to the first terminal. The method also includes generating a differential output signal from a difference between the first and second input signals and converting the output signal into a digital signal.

In a further embodiment of the invention, a method of converting an analog signal using a single-ended delta-sigma modulator having a switched capacitor circuit includes sampling a single-ended input signal, and sampling a single-ended analog feedback signal, wherein the input signal and analog feedback signal are referenced to at least one common mode reference voltage. The method also includes applying the sampled, single-ended input signal and sampled, single-ended analog feedback signal to respective input terminals of a differential integrator, integrating a difference between the sampled single-ended input signal and the sampled analog feedback signal, and providing a differential output representing the integrated difference between the sampled single-ended input signal and the sampled analog feedback signal.

In another embodiment of the present invention, a signal processing system includes an analog-to-digital delta sigma modulator. The analog-to-digital delta sigma modulator includes a switched capacitor circuit having components to implement a summer, integrator, and digital-to-analog converter, a quantizer coupled to an output of the switched capacitor circuit to quantize an input signal to the quantizer and generate a quantization output signal, and a feedback loop to provide the quantization output signal to an input of the switched capacitor circuit. The switched capacitor circuit further includes a sampling circuit to sample a single-ended input signal, a sampling circuit to sample a single-ended analog feedback signal derived from the quantization output signal, and a differential output operational-amplifier configured as an integrator, the operational-amplifier having respective input terminals to receive the sampled single-ended input signal and sampled single-ended analog feedback signal and a differential output to provide an integration of a difference between the sampled single-ended input signal and sampled single-ended analog feedback signal.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Signal processing systems described herein include an analog-to-digital delta sigma modulator to process a single-ended input signal using a single-ended analog feedback reference signal. The delta sigma modulator includes a switched capacitor circuit that integrates a difference between the single-ended input signal and the single-ended analog feedback signal derived from a quantization output of the delta sigma modulator. Embodiments of the switched capacitor circuit allow the delta sigma modulator to be implemented with fewer switches, cheaper reference signal generators, less noise, and, thus, smaller capacitors relative to conventional counterparts. Thus, embodiments of the delta sigma modulator described herein can cost less to build and use less power during operation.

Figure 5:
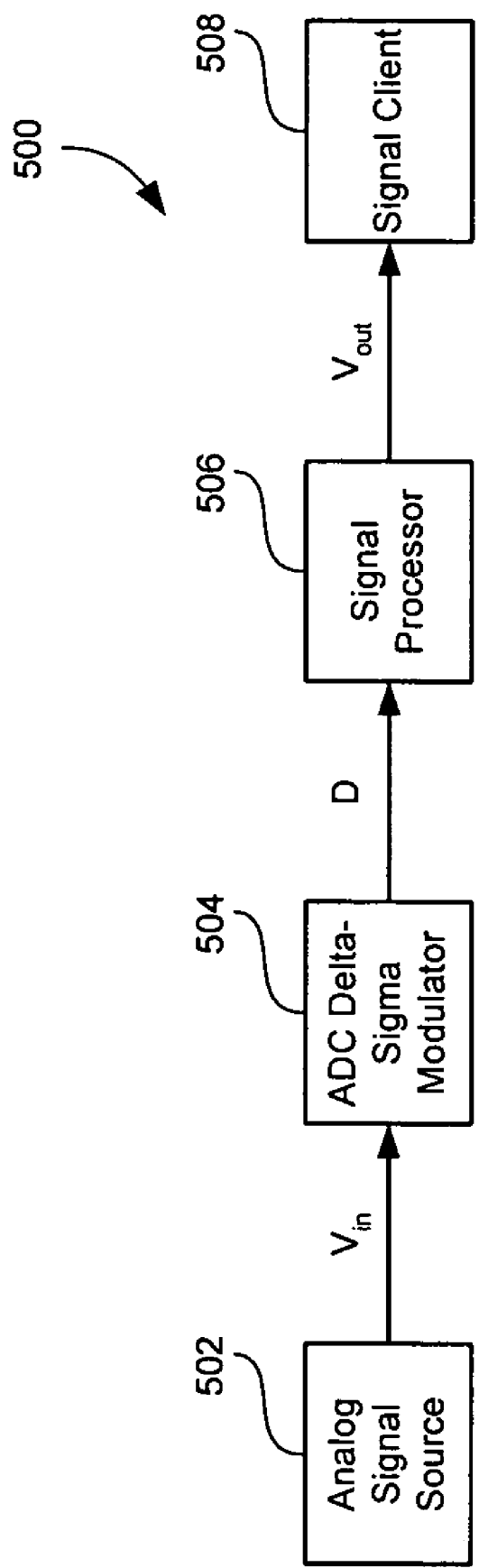
FIG. 5 depicts a signal processing system.

FIG. 5 depicts a signal processing system 500 for processing the analog input signal Vin. An analog signal source 502, such as a microphone amplifier, generates analog input signal $V_{in}$. The signal processing system 500 also often includes anti-aliasing filters to preprocess input signal $V_{in}$ prior to applying input signal $V_{in}$ to delta sigma modulator 504. The analog-to-digital delta sigma modulator 504 converts input signal $V_{in}$ into a quantized output signal D. Subsequent signal processing components process quantized output signal D in a well-known manner to generate output signal $V_{out}$. The signal client 508 uses the output signal $V_{out}$ in any number of ways. For example, in one embodiment, signal client 508 encodes output signal $V_{out}$ on a signal storage medium, such as a digital versatile disk, a compact disk, or super audio compact disk. In another embodiment, signal client 508 represents audio speakers that convert output signal $V_{out}$ into sound.

Figure 6:
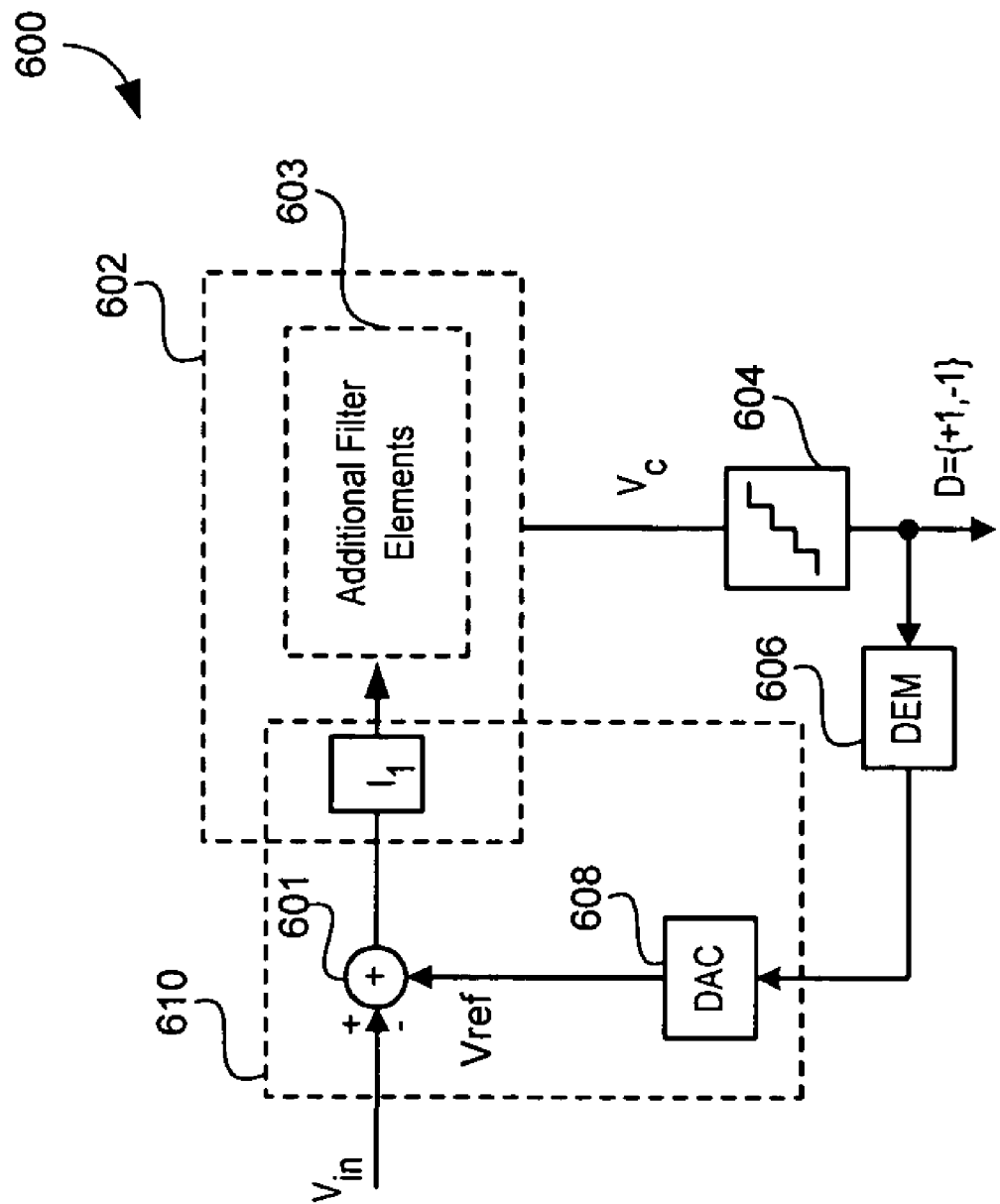
FIG. 6 depicts an analog-to-digital converter delta sigma modulator.

FIG. 6 depicts delta sigma modulator 600, which represents one embodiment of delta sigma modulator 504. The delta sigma modulator 600 includes an adder 601 that adds single-ended analog input signal $V_{in}$ to the negative of a single-ended, analog feedback signal Vref. The delta sigma modulator 600 also includes a filter 602 having a transfer function H(z). The filter 602 includes a first integrator $I_1$ and, for an N-order filter, includes N−1 additional integrators and other filter elements 603. Quantizer 604 quantizes an output signal of filter 602 using an M-bit quantizer, and M is greater than or equal to one. For a multibit quantizer 604, i.e. M>1, delta-sigma modulator 600 generally includes dynamic element matching components 606 in the feedback path between the output of quantizer 604 and the input of DAC 608. Adder 601, integrator $I_1$, and DAC 608 are implemented by a switching capacitor circuit 610.

Figure 7:
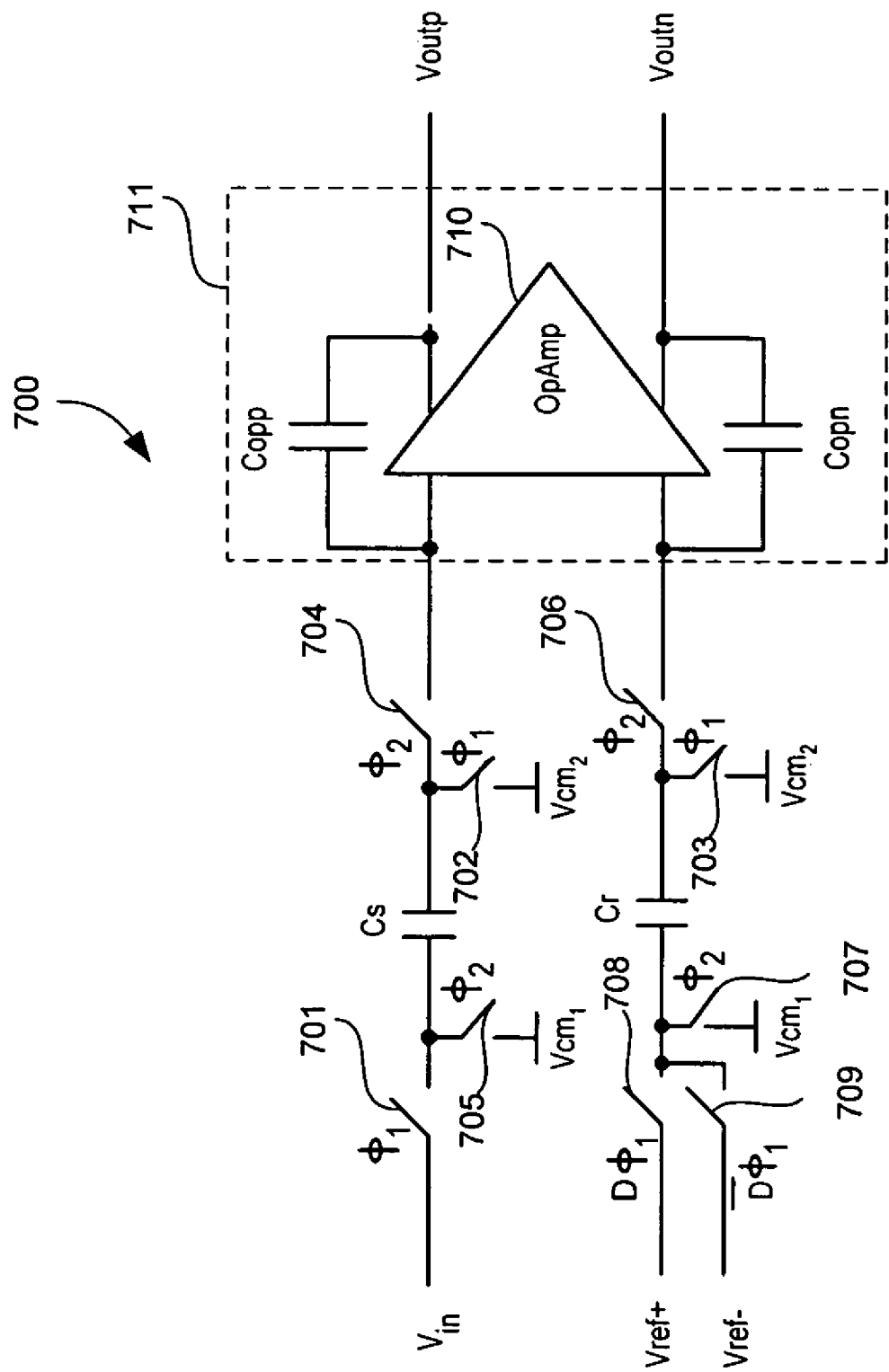
FIG. 7 depicts a switched capacitor circuit of the delta sigma modulator of FIG. 6 to receive a single-ended input signal and a single-ended analog feedback signal.

FIG. 7 depicts switching capacitor circuit 700, which represents one embodiment of switching capacitor circuit 610. The switching capacitor circuit 700 includes a differential integrator 711 to integrate a difference between signals respectively derived from the input signal $V_{in}$ and the analog feedback signal Vref. Input signal $V_{in}$ and analog feedback signal Vref are both single-ended input signals applied to respective input terminals of switching capacitor circuit 700. Equation 1 defines the relationship between Vref and the quantization output signal D for an M-bit delta sigma modulator: For a single bit delta sigma modulator, the i subscript is omitted.

$$Vref_i = \begin{cases} Vref +; D_i = +1 \\ Vref -; D_i = -1 \end{cases} \quad i \in \{0, 1, 2, \ldots, M-1\}. \quad \text{Equation 1}$$

Figure 1:
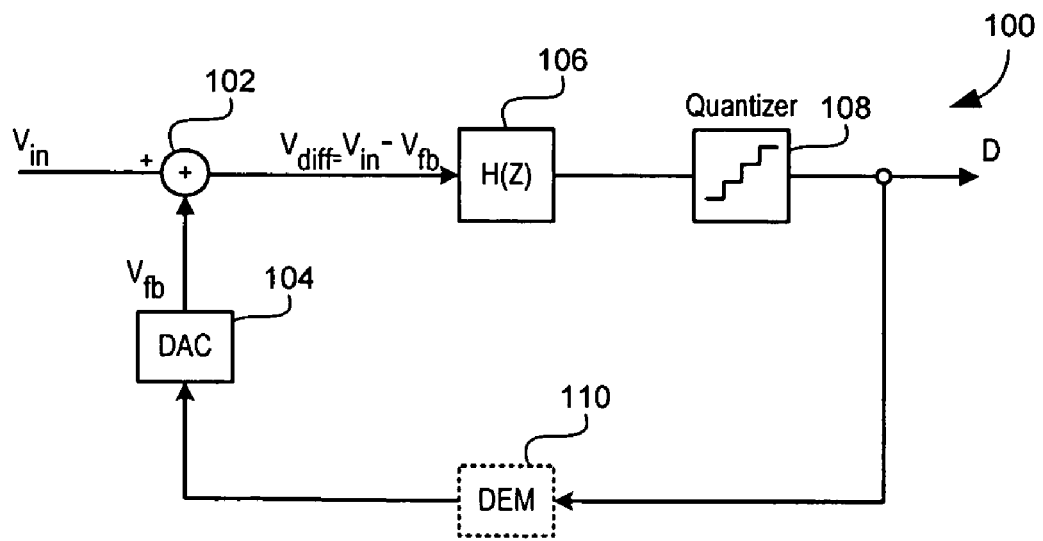
FIG. 1 (prior art) depicts an analog-to-digital converter delta sigma modulator.
Figure 2:
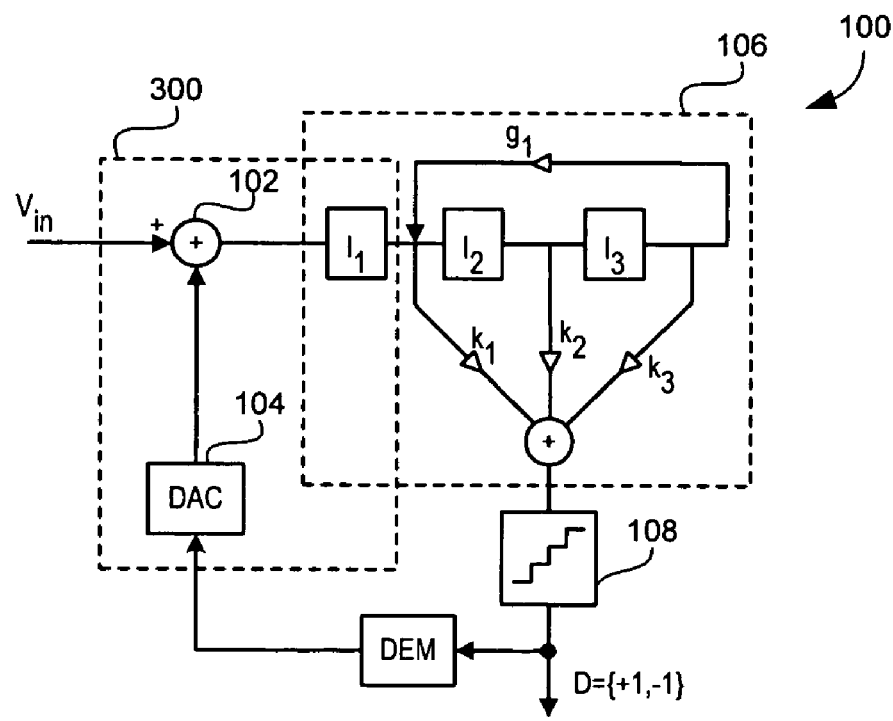
FIG. 2 (prior art) depicts the analog-to-digital converter delta sigma modulator of FIG. 1 with a third order, feed forward filter topology.
Figure 3A:
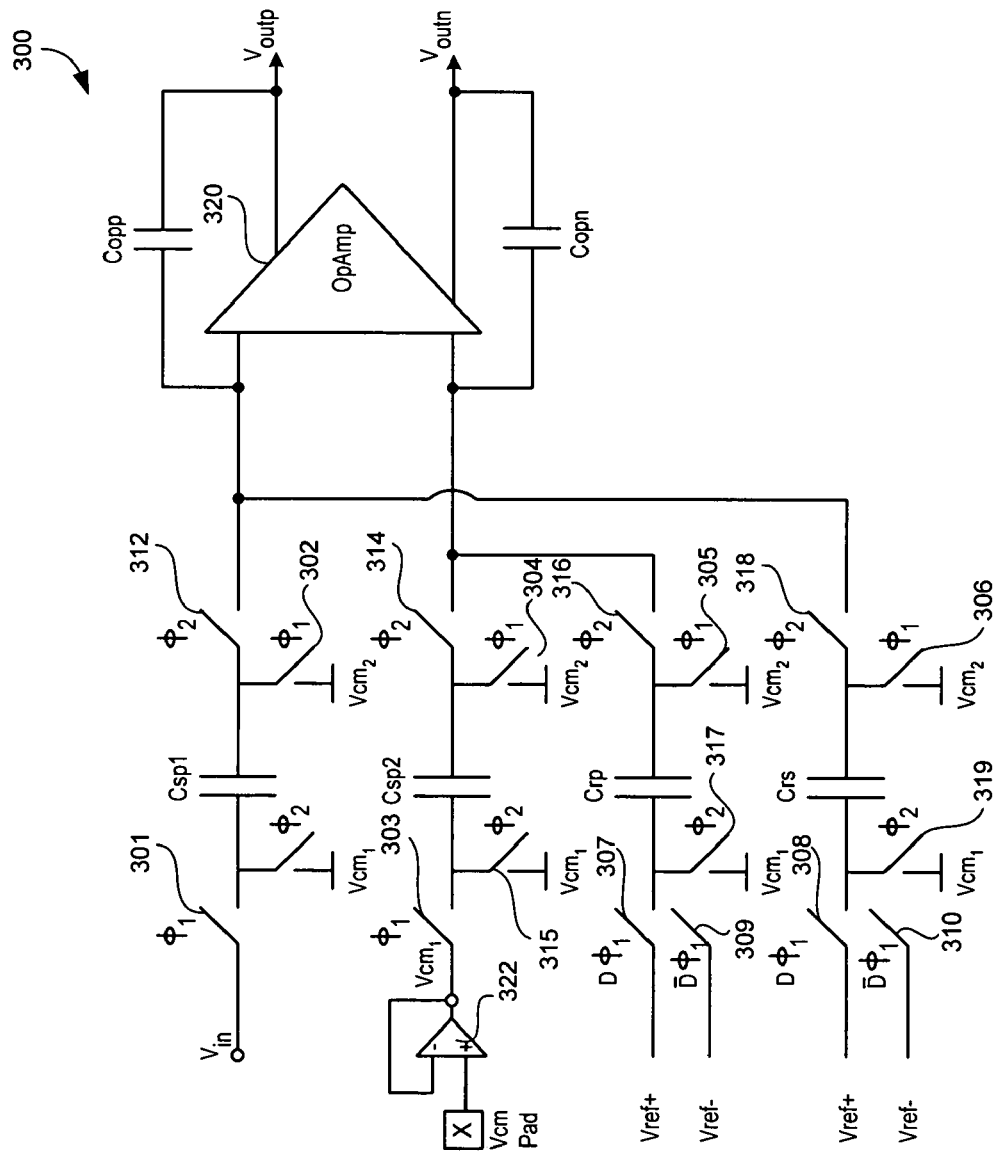
FIG. 3A (prior art) depicts a switched capacitor circuit of the delta sigma modulator of FIG. 1.
Figure 3B:
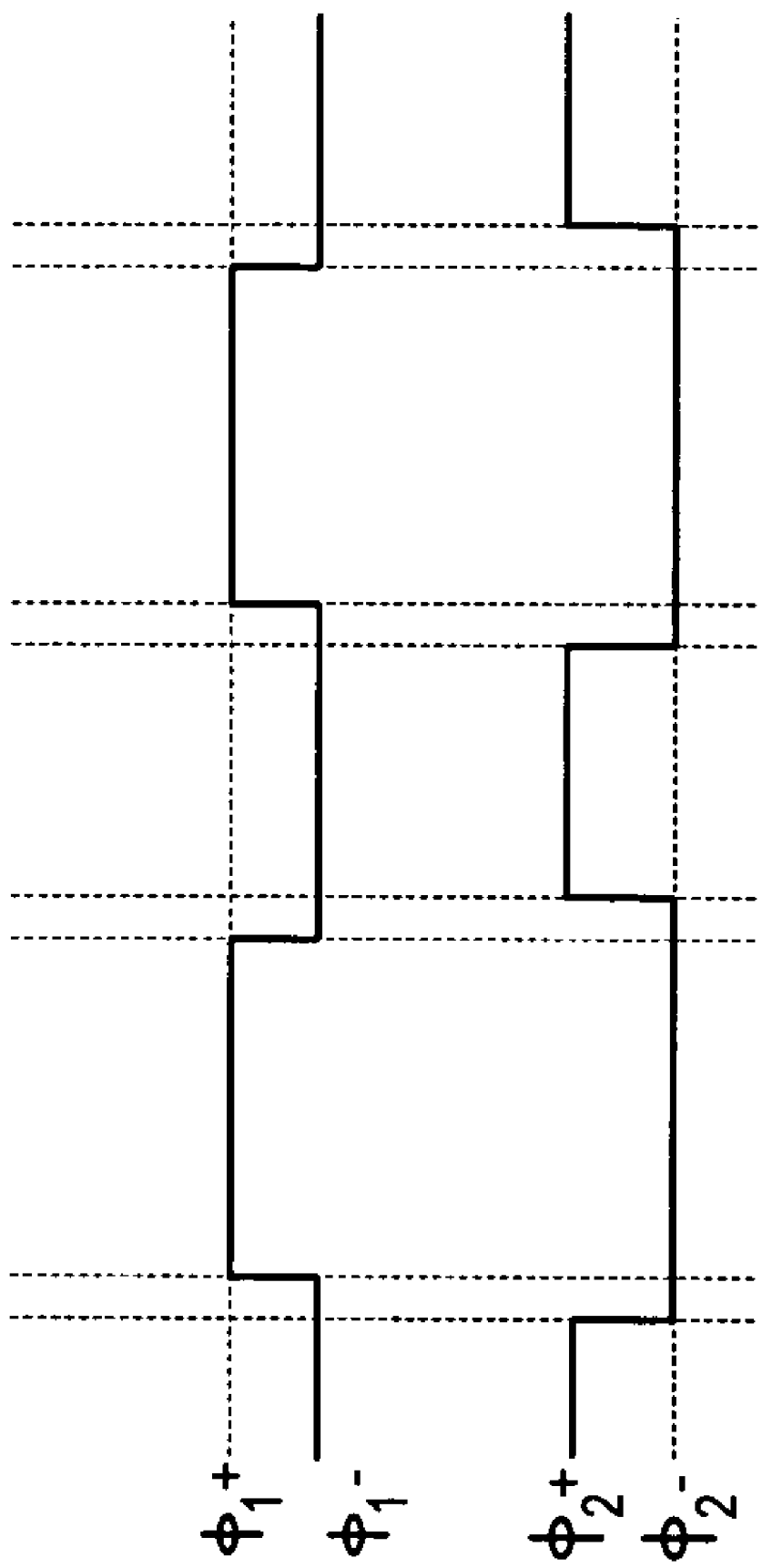
FIG. 3B (prior art) depicts a timing chart for sampling circuit control signals.
Figure 4:
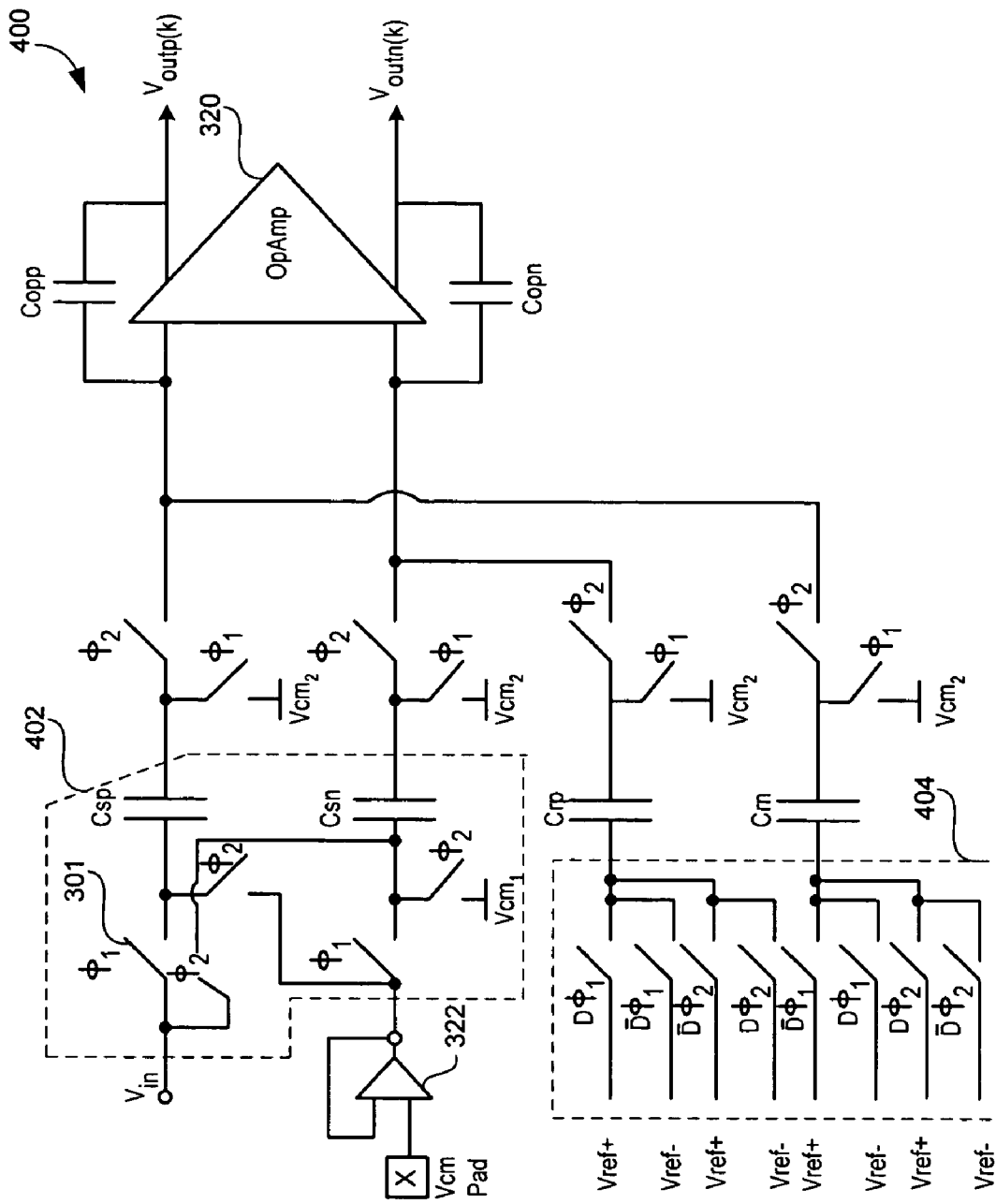
FIG. 4 depicts (prior art) depicts a double sampling switched capacitor circuit.

The sampling circuit switches of switching capacitor circuit 700 are controlled by control signals φ1 and φ2. One embodiment of control signals φ1 and φ2 is depicted in FIG. 3B. Control signal φ1+causes switches 701–703 to conduct, and control signal φ2− causes switches 704–706 to not conduct. Control signal (P1+causes switch 708 to conduct if D=1, thus sampling signal Vref+(k) across reference capacitor Cr. Otherwise, switch 709 conducts, thus causing signal Vref−(k) to be sampled across reference capacitor Cr. Input signal $V_{in}$(k) is sampled across sampling capacitor Cs when φ1=φ1+ and φ2=φ2−. Both signals $V_{in}$ and Vref are sampled relative to a common mode reference voltage Vcm1 and applied to differential inputs of operational-amplifier 710.

Control signal φ2+causes switches to 704–706 to conduct, and control signal φ1− causes switches 701–703 and 707–708 to not conduct, thus causing charge from input signal $V_{in}$(k−1) and feedback signal Vref(k−1) to be transferred to respective operational-amplifier feedback capacitors Copp and Copn. ($V_{in}$(k) at time t=$V_{in}$(k−1) at time t+1). Using the relationships set forth in Table 1 and halving sampling capacitor Cs and reference capacitor Cr relative to corresponding values for delta sigma modulator 100:

$$Vout(k)=Vout(k-1)+Vin(k-1) \cdot Cs/Cop-Vref \cdot D(k-1) \cdot Cr/Cop.$$

Thus, the architecture of switching capacitor circuit 700 is greatly reduced relative to conventional ADC delta sigma modulators. For example, the relatively expensive, low noise common mode voltage reference buffer for Vcm1 is greatly simplified or eliminated, components of the sampling circuit are eliminated thus reducing part count and simplifying operation. The size and number of sampling and reference capacitors are reduced saves chip layout real estate, reduces costs, and better facilitates use of switching capacitor circuit 700 in a low power design.

Figure 8:
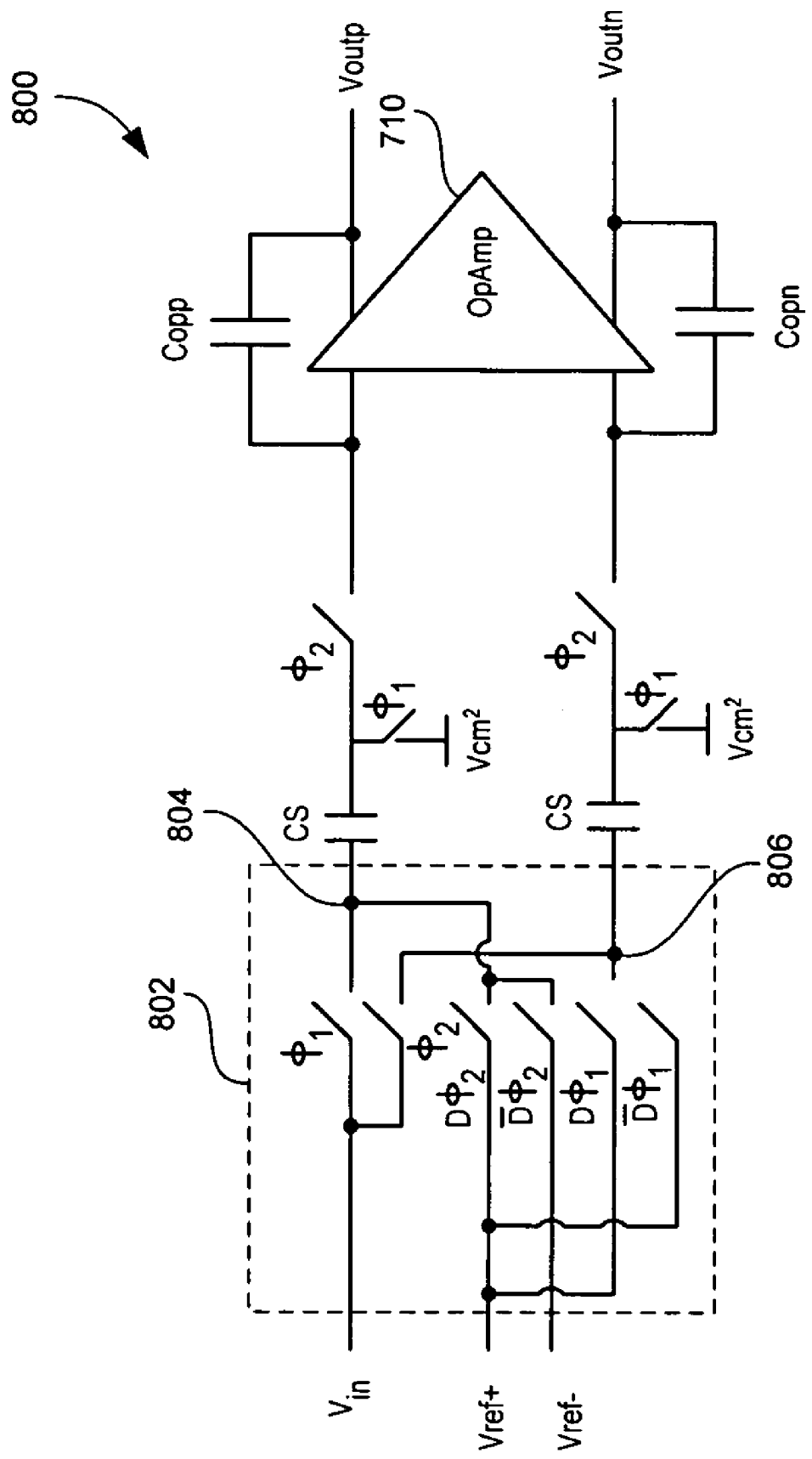
FIG. 8 depicts a double sampling version of the switched capacitor circuit of FIG. 7.

FIG. 8 depicts switched capacitor circuit 800, which is one embodiment of a double sampling version of switching capacitor circuit 700. The switched capacitor circuit 800 functions identically to switching capacitor circuit 700 except that sampling circuit 802 alternates in time the input terminals to which single-ended input signal $V_{in}$ and single-ended analog feedback signal Vref are applied. In other words, switching capacitor circuit 700 alternately couples input signal $V_{in}$ to input terminals 804 and 806 and alternately couples analog feedback signal Vref to input terminals 806 and 804 without overlapping input signal $V_{in}$ and feedback signal Vref. Additionally, by alternating input signal $V_{in}$ and feedback signal Vref between input terminals of switched capacitor circuit 800, the reference voltage Vcm1 is eliminated altogether. The natural common mode rejection of operational-amplifier 710 permits conditioning of reference voltage Vcm1 by a less expensive, signal path reference voltage buffer or complete elimination of the signal path reference voltage buffer Using the settings set forth in Table 1 and halving sampling capacitor Cs and reference capacitor Cr relative to corresponding values for delta sigma modulator 100:

$$Vout(k)=Voutp(k-1)+2 \cdot Vin(k-1) \cdot Cs/Cop-2 \cdot Vref \cdot D(k-1) \cdot Cr/Cop \quad \text{Equation 2}$$

The doubling term "2" in Equation 2 occurs because I+$V_{in}$(k−½) is approximately 2 when the sampling frequency, $F_s$, of switching capacitor circuit 700 is several times, e.g. 64 or 128, higher than the Nyquist frequency relative to the upper frequency of the baseband. For example, in an audio signal processing application, the baseband extends from 0 Hz to approximately 20 kHz, the Nyquist frequency is 48 kHz, and $F_s$ is, for example, 3.072 MHz.

Figure 9:
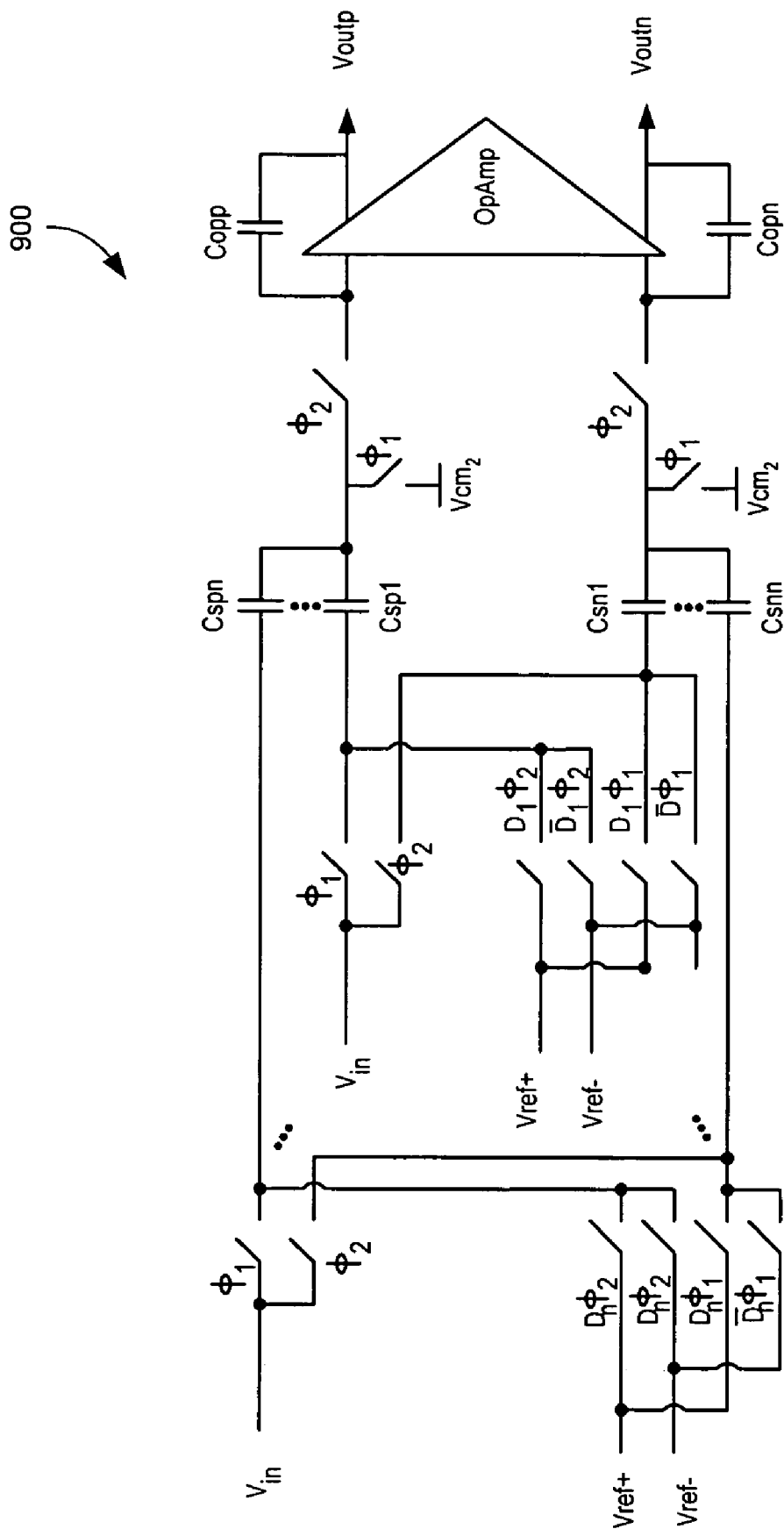
FIG. 9 depicts a multi-bit version of the switched capacitor circuit of FIG. 8.

FIG. 9 depicts multi-bit switched capacitor circuit 900, which is a multi-bit version of switched capacitor circuit 800. For an n-bit quantizer 604, the multi-bit switched capacitor circuit 900 replicates sampling circuit 802, sampling capacitor Cs, reference capacitor Cr, and input terminals 804 and 806 n times. Thus, multi-bit switched capacitor circuit 900 achieves the advantages of switching capacitor circuit 700 and switched capacitor circuit 800 in a multi-bit implementation.

Although the present invention has been described in detail, it should be understood that various changes, substitutions and alterations can be made hereto without departing from the spirit and scope of the invention as defined by the appended claims. For example, delta sigma modulator 504 can include a filter 602 can be any order.

What is claimed is:

1. A signal processing system comprising:
   a single-ended input analog-to-digital delta sigma modulator, wherein the analog-to-digital delta-sigma modulator further comprises:
   a switched capacitor circuit having a differential integrator, the differential integrator comprising:
   a first input terminal to receive a first input signal derived from a sampled, single-ended input signal relative to a first reference voltage;
   a second input terminal to receive a second input signal derived from a sampled, single-ended analog feedback signal relative to a second reference voltage; and
   integration circuitry to provide a differential output representing an integration of a difference between the first and second input signals.

2. The signal processing system of claim 1 wherein the differential integrator comprises:
an operational-amplifier having differential input terminals coupled to the first and second input terminals and differential output terminals to conduct the differential output; and
a pair of capacitors coupled between respective input and output terminals of the operational-amplifier.

3. The signal processing system of claim 1 wherein the signal processing system further comprises:
an analog signal input source coupled to the delta sigma modulator to provide the input signal to be sampled; and
digital signal processing components coupled to an output terminal of the differential integrator to process an output signal of the differential integrator.

4. The signal processing system of claim 1 wherein the switched capacitor circuit further comprises:
first and second sampling capacitors respectively coupled to the first and second input terminals of the differential integrator;
first and second feedback capacitors coupled between an output terminal of the differential integrator and respectively coupled to the first and second input terminals of the differential integrator; and
a sampling circuit, wherein the sampling circuit comprises:
a first input terminal to receive the sampled, single-ended input signal;
a second input terminal to receive the analog feedback signal;
a first set of switches to couple the sampled, single-ended input signal and a first reference voltage source across the first sampling capacitor during a first time period, wherein the first reference voltage source provides the first reference voltage;
a second set of switches to couple the first sampling capacitor across a third reference voltage source and the first input terminal of the differential integrator during a second time period;
a third set of switches to couple the analog feedback signal and a second reference voltage source across the second sampling capacitor during a third time period, wherein the second reference voltage source provides the second reference voltage; and
a fourth set of switches to couple the second sampling capacitor across a fourth reference voltage source and the second input terminal of the differential integrator during a fourth time period.

5. The signal processing system of claim 4 wherein the first time period and the third time period are substantially identical, the second time period and the fourth period are substantially identical, and the first and third time periods are non-overlapping with the second and fourth time periods.

6. The signal processing system of claim 1 wherein the switched capacitor circuit comprises an integrator, a digital to analog converter, and an adding circuit.

7. The signal processing system of claim 1 wherein the first reference voltage and the second reference voltage are equal to or at least approximately equal to a common mode voltage of the differential integrator.

8. The signal processing system of claim 1 further comprising:
a double sampling circuit to alternately couple the first input signal to the first and second input terminals of the differential integrator during non-overlapping first and second time periods and alternately couple the second signal across the second and first input terminals of the differential integrator respectively during the second and first time periods.

9. The signal processing system of claim 1 wherein the delta sigma modulator is a single bit delta sigma modulator.

10. The signal processing system of claim 1 wherein the delta sigma modulator is a multi-bit delta sigma modulator.

11. The signal processing system of claim 1 wherein the delta sigma modulator further comprises a quantizer, the sampled analog feedback signal corresponds to an output value of the quantizer.

12. The signal processing system of claim 1 wherein the sampled input signal is an audio signal.

13. A method of converting an analog signal into a digital signal using a single-ended delta-sigma modulator having a switched capacitor circuit, the method comprising:
deriving a first input signal from a sampled, single-ended input signal relative to a first reference voltage
applying the first input signal to a first terminal of a differential integrator of the switched capacitor circuit;
deriving a second input signal from a sampled, single-ended analog feedback signal relative to a second reference voltage;
applying the second input signal to a second terminal of the differential integrator concurrently with the application of the first input signal to the first terminal;
generating a differential output signal from a difference between the first and second input signals; and
converting the output signal into a digital signal.

14. The method of claim 13 wherein the differential integrator comprises:
an operational-amplifier having differential input terminals coupled to the first and second input terminals and differential output terminals to conduct the differential output; and
a pair of capacitors coupled between respective input and output terminals of the operational-amplifier.

15. The method of claim 13 further comprising:
receiving the analog input signal from an analog signal source; and
processing an output signal.

16. The method of claim 13 wherein the sampled input signal is an audio signal.

17. The method of claim 13 wherein the switched capacitor circuit further includes first and second sampling capacitors respectively coupled to the first and second input terminals of the differential integrator and includes first and second feedback capacitors coupled between an output terminal of the differential integrator and respectively coupled to the first and second input terminals of the differential integrator, the method further comprising:
coupling the input signal and a first reference voltage source across the first sampling capacitor during a first time period, wherein the first reference voltage source provides the first reference voltage;
coupling the first sampling capacitor across a third reference voltage source and the first input terminal of the differential integrator during a second time period;
coupling the analog feedback signal and a second reference voltage source across the second sampling capacitor during a third time period, wherein the second reference voltage source provides the second reference voltage; and
coupling the second sampling capacitor across a fourth reference voltage source and the second input terminal of the differential integrator during a fourth time period.

18. The method of claim 17 wherein the first time period and the third time period are substantially identical, the second time period and the fourth period are substantially identical, and the first and third time periods are non-overlapping with the second and fourth time periods.

19. The method of claim 17 wherein the first reference voltage and the second reference voltage are equal to or at least approximately equal to a common mode voltage of the differential integrator.

20. The method of claim 17 further comprising:
alternately coupling the first input signal to the first and second input terminals of the differential integrator during non-overlapping first and second time periods; and
alternately coupling the second input signal across the second and first input terminals of the differential integrator respectively during the second and first time periods.

21. The method of claim 17 wherein the delta sigma modulator is a single bit delta sigma modulator.

22. The method of claim 17 wherein the delta sigma modulator is a multi-bit delta sigma modulator.

23. The method of claim 17 further comprising:
deriving the analog feedback signal from an output signal of a quantizer.

24. A method of converting an analog signal using a single-ended delta-sigma modulator having a switched capacitor circuit, the method comprising:
sampling a single-ended input signal;
sampling a single-ended analog feedback signal, wherein the input signal and analog feedback signal are referenced to at least one common mode reference voltage;
applying the sampled, single-ended input signal and sampled, single-ended analog feedback signal to respective input terminals of a differential integrator;
integrating a difference between the sampled single-ended input signal and the sampled analog feedback signal; and
providing a differential output representing the integrated difference between the sampled single-ended input signal and the sampled analog feedback signal.

25. The method of claim 24 further comprising:
processing an output signal of the switched capacitor circuit to generate a quantized output signal.

26. The method of claim 25 further comprising:
processing the quantized output signal; and
storing the processed quantized output signal on a recordable storage medium.

27. A signal processing system comprising:
an analog-to-digital delta sigma modulator comprising:
a switched capacitor circuit having components to implement a summer, integrator, and digital-to-analog converter;
a quantizer coupled to an output of the switched capacitor circuit to quantize an input signal to the quantizer and generate a quantization output signal; and
a feedback loop to provide the quantization output signal to an input of the switched capacitor circuit;
wherein the switched capacitor circuit further comprises:
a sampling circuit to sample a single-ended input signal;
a sampling circuit to sample a single-ended analog feedback signal derived from the quantization output signal; and
a differential output operational-amplifier configured as an integrator, the operational-amplifier having respective input terminals to receive the sampled single-ended input signal and sampled single-ended analog feedback signal and a differential output to provide an integration of a difference between the sampled single-ended input signal and sampled single-ended analog feedback signal.

28. The signal processing system of claim 27 further comprising:
signal processing components to process an output signal of the delta sigma modulator and store a digital representation of the single-ended input signal on a storage medium.

29. The signal processing system of claim 27 further comprising:
signal processing components to process an output signal of the delta sigma modulator, convert the output signal of the delta sigma modulator into an analog signal, and provide the analog signal to a signal playback system.

30. The signal processing system of claim 27 wherein the input terminals of the operational-amplifier further comprise first and second input terminals, the signal processing system further comprising:
a double sampling circuit to alternately couple the sampled single-ended input signal to the first and second input terminals of the operational-amplifier during non-overlapping first and second time periods and alternately couple the sampled single-ended analog feedback signal across the second and first input terminals of the operational-amplifier respectively during the second and first time periods.

* * * * *

UNITED STATES PATENT AND TRADEMARK OFFICE
CERTIFICATE OF CORRECTION

PATENT NO. : 6,972,705 B1
DATED : December 6, 2005
INVENTOR(S) : Xiaofan Fei, Johann Gaboriau and John L. Melanson It is certified that error appears in the above-identified patent and that said Letters Patent is hereby corrected as shown below:

Column 5,
Line 41, "(P1+causes" should be -- φ1+ causes".
Line 49, "φ2+causes" should be -- φ2+ causes --.

Signed and Sealed this

Twenty-first Day of February, 2006

JON W. DUDAS
*Director of the United States Patent and Trademark Office*